United States Patent
Choi

(10) Patent No.: US 8,228,709 B2
(45) Date of Patent: Jul. 24, 2012

(54) RESISTANCE VARIABLE MEMORY DEVICE AND SYSTEM

(75) Inventor: Youngdon Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 339 days.

(21) Appl. No.: 12/611,210

(22) Filed: Nov. 3, 2009

(65) Prior Publication Data

US 2010/0110768 A1    May 6, 2010

(30) Foreign Application Priority Data

Nov. 4, 2008  (KR) .................. 10-2008-0108967

(51) Int. Cl.
*G11C 11/00*  (2006.01)
*G11C 7/02*  (2006.01)
*G11C 7/04*  (2006.01)

(52) U.S. Cl. .................. 365/148; 365/207; 365/210.11; 365/210.12; 365/211

(58) Field of Classification Search .................. 365/148, 365/207, 210.11, 210.12, 211
See application file for complete search history.

(56) References Cited

U.S. PATENT DOCUMENTS

| | | | | |
|---|---|---|---|---|
| 4,287,570 | A | * | 9/1981 | Stark .............................. 365/104 |
| 7,269,080 | B2 | | 9/2007 | Bedeschi et al. |
| 2005/0195672 | A1 | * | 9/2005 | Lee ................................ 365/207 |
| 2009/0256612 | A1 | * | 10/2009 | Rho .............................. 327/276 |
| 2009/0257298 | A1 | * | 10/2009 | Kajigaya et al. .............. 365/207 |
| 2009/0310429 | A1 | * | 12/2009 | Cho ......................... 365/189.07 |
| 2010/0039173 | A1 | * | 2/2010 | Chang et al. .................. 327/563 |
| 2010/0103725 | A1 | * | 4/2010 | Kim et al. ..................... 365/163 |

FOREIGN PATENT DOCUMENTS

| KR | 1020000040543 A | 7/2000 |
|---|---|---|
| KR | 100631049 B1 | 9/2006 |

* cited by examiner

*Primary Examiner* — Ly D Pham
(74) *Attorney, Agent, or Firm* — Volentine & Whitt, PLLC

(57) ABSTRACT

Disclosed is a resistance variable memory device including a memory cell connected with a bit line, a sense amplifier circuit sensing a voltage level on the bit line, and a pseudo-replica providing the sense amplifier circuit with a control signal that compensates for a drop in the sensing capacity of the sense amplifier circuit in relation to process, voltage and temperature (PVT) variations.

13 Claims, 12 Drawing Sheets

RESISTANCE VARIABLE MEMORY DEVICE AND SYSTEM

CROSS-REFERENCE TO RELATED APPLICATION

This U.S. non-provisional patent application claims priority under 35 U.S.C §119 to Korean Patent Application No. 10-2008-0108967 filed on Nov. 4, 2008, the subject matter of which is hereby incorporated by reference.

BACKGROUND

The present inventive concept relates to resistance variable memories. More particularly, the inventive concept relates to resistance variable memories having performance characteristics less susceptible to variations in Process, Voltage and Temperature (PVT).

Semiconductor memory devices may be categorized as volatile and nonvolatile according to their ability to retain stored data in relation to applied power. Memory devices that lose stored data in the absence of applied power are volatile. Volatile memory includes Dynamic RAM (DRAM), Static RAM (SRAM), and similar types of memory that generally use a capacitor to store data.

Memory devices that retain stored data in the absence of applied power are non-volatile. Nonvolatile memories include Programmable ROM (PROM), Erasable PROM (EPROM), Electrically EPROM (EEPROM), flash memory (including NOR and NAND flash memories), and the like. Nonvolatile memory replaces the conventional capacitor used in volatile memory to store data with some nonvolatile form of data storage. Thus, nonvolatile memory includes Ferroelectric RAM (FRAM) which uses a ferroelectric capacitor, Magnetic RAM (MRAM) which uses a Tunneling Magneto-Resistive (TMR) film, phase change memory devices using phase changeable materials like chalcogenide alloys, etc.

Within the general class of nonvolatile memory devices, the phase change memory device is particularly susceptible to variations in temperature. However, phase change memory devices are characterized by fabrication processes that are relatively simple, and by an ability to densely integrate constituent memory cells at low cost. Accordingly, phase change memory devices offer great promise for future applications.

Contemporary phase change memory devices include a write driver circuit that supplies a program current to the constituent phase change material (e.g., Ge—Sb—Te or GST) of a selected phase change memory cell during a program operation. The write driver circuit may be configured to supply the program current, (i.e., supply a SET current or RESET current to a selected phase change memory cell storing binary data), using an externally provided power supply voltage (e.g., over 2.5V), where the SET current is a current placing the phase change material in a SET state, and the RESET current is a current placing the phase change material in a RESET state.

SUMMARY

Embodiments of the inventive concept provide a resistance variable memory device and related memory systems having performance characteristics less susceptible to PVT variations.

In one aspect, embodiments of the inventive concept provide a resistance variable memory device comprising; a memory cell connected to a bit line, a sense amplifier circuit having a sensing capacity and configured to sense a sense voltage on the bit line, and a pseudo-replica circuit providing the sense amplifier circuit with a control signal compensating for a drop in the sensing capacity of the sense amplifier circuit caused by variations in process, voltage and temperature (PVT).

In another aspect, embodiments of the inventive concept provide a method of compensating for variations in process, voltage and temperature (PVT) in a resistance variable memory device having a memory cell connected to a bit line, the method comprising; using a sense amplifier circuit having a defined sensing capacity, sensing a sense voltage on the bit line, using a comparator comparing the sense voltage with a reference voltage, using a pseudo-replica circuit implemented with elements configured to mimic compensate for a bias circuit, providing the sense amplifier circuit with a control signal compensating for a drop in the sensing capacity of the sense amplifier circuit caused by PVT variations, and using the bias circuit, providing a bias voltage to the bit line in response to the control signal, wherein the bias voltage is varied in response to the control signal.

BRIEF DESCRIPTION OF THE FIGURES

Certain embodiments of the inventive concept will be described with reference to the accompanying drawings. In the drawings.

DETAILED DESCRIPTION OF THE EMBODIMENTS

Figure 1:
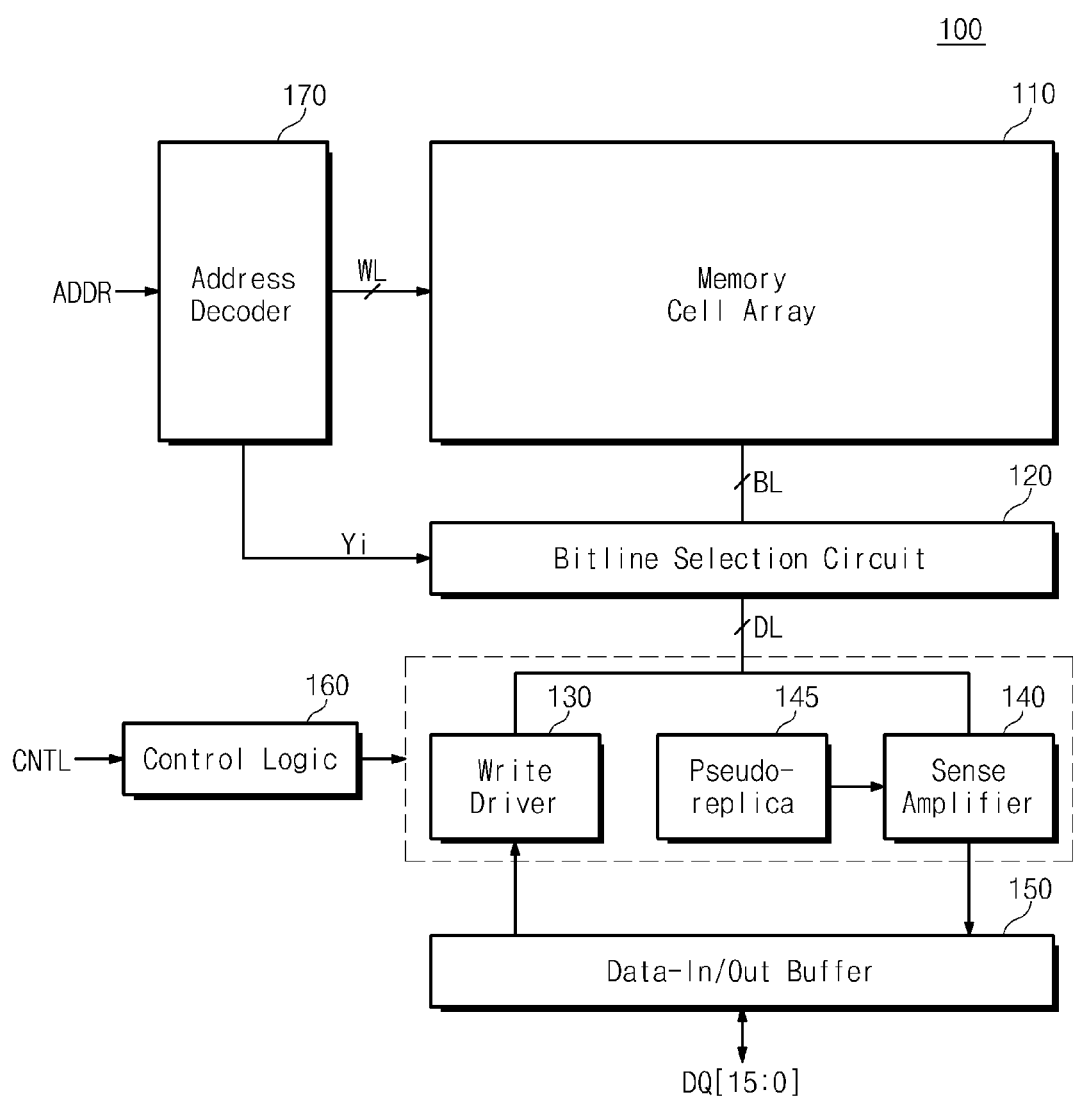
FIG. 1 is a block diagram illustrating a resistance variable memory device according to an embodiment of the inventive concept.

FIG. 1 is a block diagram illustrating a resistance variable memory device according to an embodiment of the inventive concept. Referring to FIG. 1, a resistance variable memory device 100 comprises a memory cell array 110, a bit line selection circuit 120, a write driver circuit 130, a sense amplifier circuit 140, a data input/output buffer circuit 150, control logic 160, and an address decoder circuit 170.

The memory cell array 110 includes a plurality of memory cells, wherein each memory cell includes a resistance variable memory element. In one more specific embodiment of the inventive concept, the resistance variable memory element may be a phase change memory cell.

That is, each memory cell in the memory cell array 110 may be formed from a memory element and a select element. The memory element in one embodiment of the inventive concept is a phase change material such as GST. The select element is an NMOS transistor or a diode. The phase change material, as part of the resistance variable element, has a resistance value that may be changed in relation to an applied thermal energy. Such thermal energy is typically applied by passing a carefully defined electrical current through the phase change material. Some phase change material may be practically placed in one of two stable states, i.e., a crystalline state and an amorphous state. Other phase change materials may be placed in more than two stable states. For simplicity of explanation, only bi-state phase change materials will be described hereafter, but those skilled in the art will recognize that the inventive subject matter may be readily extended to multi-state (more than two) phase change materials.

The state of a phase change material like GST is typically changed between the crystalline state and amorphous state by applying current via a bit line BL connected to the resistance variable element of a selected memory cell within a phase change memory device. In this manner, different resistance values for the two states of the phase change material may be used to define (or program) data in the selected phase change memory cell. However, these resistance values will vary with PVT variations. Embodiments of the inventive concept address this potential problem by providing resistance variable memory devices that are relatively insusceptible to PVT variations. That is, defined resistance values associated with each state of the phase change memory cells within a resistance variable memory cell according to an embodiment of the inventive concept will vary significantly less than conventional phase change memory cells in relation to variations in PVT.

Returning to FIG. 1, the address decoder circuit 170 is connected with the memory cell array 110 via a plurality of word lines WL. The address decoder circuit 170 decodes an externally applied address ADDR (e.g., during a read operation), generates a bias voltage, and then applies the bias voltage to a selected word line, where the selected word line is connected to a selected memory cell identified by the address ADDR. The address decoder circuit 170 similarly generates a select signal Yi and applies the select signal to a selected bit line BL via bit line selection circuit 120.

The bit line selection circuit 120 is connected with the memory cell array 110 via a plurality of bit lines BL. During a read or program operations, the bit line selection circuit 120 selects bit lines BL connected to the memory cell array 110 in response to the select signals Yi from the address decoder circuit 170. The bit line selection circuit 120 may include a plurality of NMOS transistors, as further described in relation to FIGS. 2 and 3. Each NMOS transistor may be used to connect a bit line BL and a data line DL in response to the select signal Yi.

The write driver circuit 130 receives (e.g.,) write data DQ[15:0] via the data input/output circuit 150. The write driver circuit 130 also receives program pulses from the control logic 160 and supplies a program current to a selected data line DL in relation to the received data. As is conventionally understood, the program pulses may be provided using an iterative programming loop circuit (not shown) within the control logic 160. The provided program pulses may include both a SET pulse and a RESET pulse. When a write data value of '0' is received, the write driver circuit 130 supplies the SET current in response to the SET pulse. When a write data value of '1' is received, the write driver circuit 130 supplies the RESET current in response to the RESET pulse.

During a read operation or program verify operation, the sense amplifier circuit 140 retrieves read data stored in a selected memory cell, and outputs the read data to the data input/output circuit 150. The control logic 160 controls the write driver circuit 130 and the sense amplifier circuit 140 in response to a control signal CNTL to execute a read operation or a program verify operation.

The resistance variable memory device 100 provides the pseudo-replica circuit 145 that is insusceptible (or insensitive) to PVT variations. The pseudo-replica circuit 145 may be configured with a structure and component connection layout that is very similar to that of the sense amplifier circuit 140. The structure and operation of one possible pseudo-replica circuit 145 will be described in some additional detail with reference to FIGS. 2 through 4.

Figure 2:
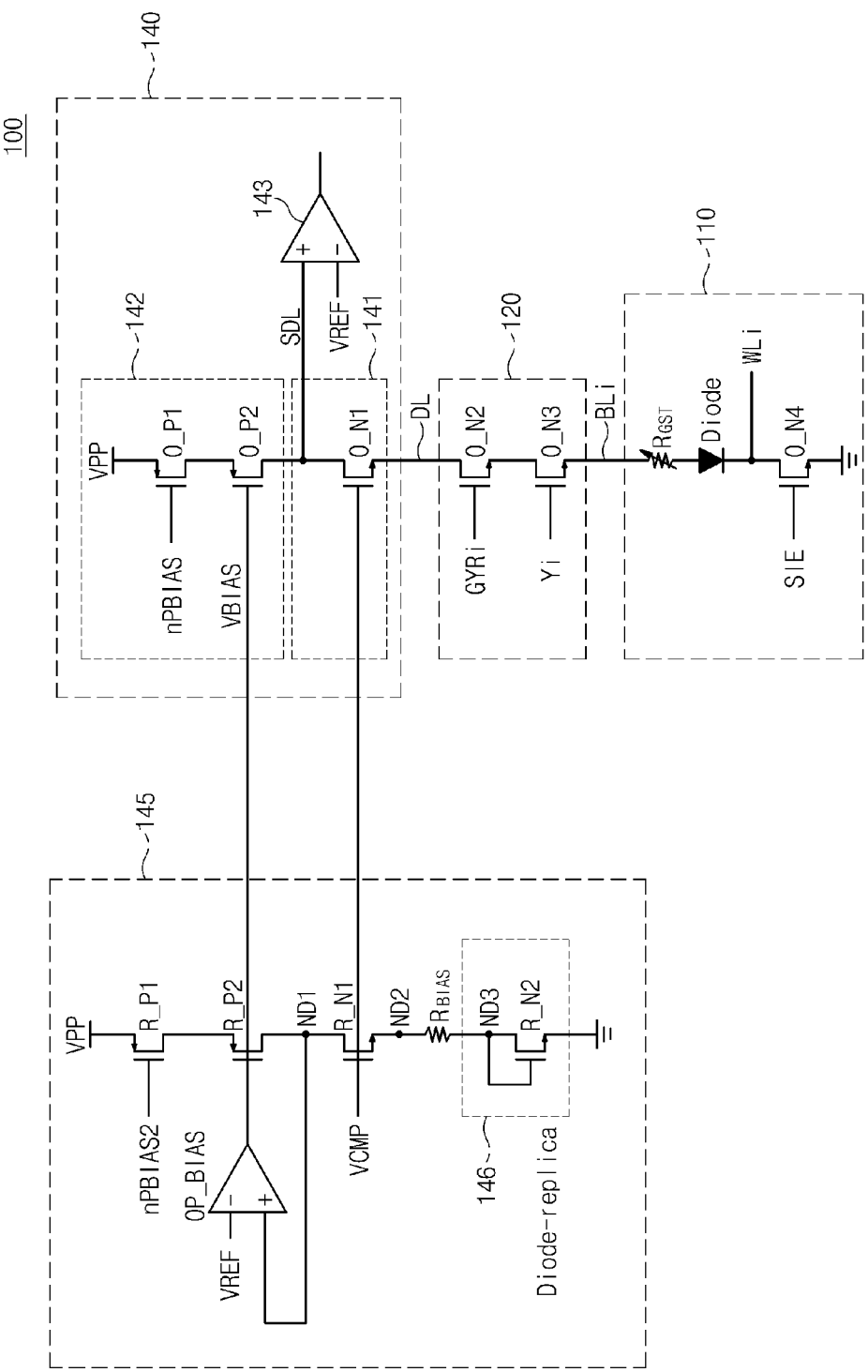
FIG. 2 is a circuit diagram illustrating in one embodiment of the inventive concept the sense amplifier circuit and pseudo-replica circuit of FIG. 1.

FIG. 2 is a circuit diagram further illustrating the sense amplifier circuit 140 and a pseudo-replica circuit 145 of FIG. 1 according to an embodiment of the inventive concept.

Referring collectively to FIGS. 1 and 2, the sense amplifier circuit 140 includes a clamping circuit 141, a bias circuit 142, and a comparator 143.

The clamping circuit 141 clamps a voltage level on a data line DL to a predetermined voltage level during a read operation. This means that a voltage level on a selected bit line BL is clamped to a given voltage level by the clamping circuit 141. In the embodiment illustrated in FIG. 2, the clamping circuit 141 is formed from an NMOS transistor O_N1. The NMOS transistor O_N1 forms a current path between the sensing node SDL and a data line DL of the bit line selection circuit 120 in response to a clamp voltage signal VCMP. The clamp voltage signal VCMP is provided from control logic 160 and has a constant DC voltage level during the read operation.

For example, the clamp voltage signal VCMP may be formed by the voltage on a bit line plus a threshold voltage of the NMOS transistor O_N1. Thus it may be assumed that during the read operation, the voltage on the bit line is 1V and the threshold voltage of the NMOS transistor O_N1 is 0.5V. Under these assumptions, the clamp voltage signal VCMP will have a DC voltage of 1.5V. The clamp voltage signal VCMP may be made from an internal voltage generator circuit (not shown) that is relatively insensitive to PVT variations. Such an internal voltage generator circuit may be included within the control logic 160.

The bias circuit 142 supplies a read current to the selected bit line BL during a read operation. In the embodiment illustrated in FIG. 2, the bias circuit 142 is connected between a sensing node SDL and a boosted voltage VPP. Thus, the bias circuit 142 is supplied with the boosted voltage VPP during the read operation. The bias circuit 142 in the illustrated embodiment is formed by two series connected PMOS transistors O_P1 and O_P2.

The first PMOS transistor O_P1 supplies the boosted voltage VPP to the second PMOS transistor O_P2 in response to a signal nPBIAS. The second PMOS transistor O_P2 supplies read current to a selected bit line in response to a bias voltage signal VBIAS. The bias voltage signal VBIAS is provided from the control logic 160 and has a given DC voltage level during the read operation.

The comparator 143 senses a difference between a reference voltage VREF and the voltage apparent on the sensing node SDL during the read operation, and provides the sensed result to an input/output buffer circuit 150. The reference voltage VREF may be supplied by a conventionally provided reference voltage generator circuit (not shown). The sense amplifier circuit 140 receives a control signal from the control logic 160 and the boosted voltage VPP from a boosting circuit (now shown) during the read operation.

The control logic 160 is generally configured to generate control signals for controlling the clamping circuit 141 and the bias circuit 142 in response to externally received command(s).

As illustrated in FIG. 2, a memory cell 110 is formed from a resistance variable element ($R_{GST}$) and a select element (Diode). The bit line selection circuit 120 selects a bit line of the memory cell 110 in response to select signals GYRi and Yi. When a signal SIE is enabled, a word line WLi is activated.

A resistance variable memory device 100 according to the present inventive concept provides the bias voltage signal VBIAS to the sense amplifier circuit 140 to mitigate the effects of PVT variations. Thus, the pseudo-replica circuit 145 incorporated within embodiments of the inventive concept may be configured to correspond to (or "mimic compensate") the sense amplifier circuit 140 and the memory cell 110 in response to variations in PVT.

With continuing reference to FIGS. 1 and 2, the pseudo-replica circuit 145 includes an NMOS transistor R_N1 corresponding to the clamp circuit 141, the first and second PMOS transistors R_P1 and R_P2 corresponding to the bias circuit 142, a resistor RBIAS corresponding to a resistance variable element of the memory cell 110, and a diode-replica 146 corresponding to the select element Diode of the memory cell 110. The diode-replica, as illustrated in FIG. 2, may be implemented using a diode-connected NMOS transistor.

The first and second PMOS transistors R_P1 and R_P2 are connected in series between the boosted voltage VPP and the first node ND1. The first PMOS transistor R_P1 is controlled by a signal nPBIAS2, and the second PMOS transistor R_P2 is controlled by the bias voltage signal VBIAS being an output of an operational amplifier OP_BIAS.

The reference voltage VREF is supplied to a negative terminal of the operational amplifier OP_BIAS, and a voltage on the first node ND1 corresponding to the sensing node SDL is supplied to a positive terminal of the operational amplifier OP_BIAS. The bias voltage signal VBIAS is applied identically to the PMOS transistors O_P2 and R_P2. The first NMOS transistor R_N1 is connected between the first node ND1 and the second node ND2 and is controlled by the clamp voltage signal VCMP.

Although not shown in FIG. 2, the pseudo-replica circuit 145 may further comprise the same constituent element(s) as the bit line selection circuit 120 between the second node ND2 and the resistor $R_{BIAS}$. Further, although not shown in FIG. 2, the pseudo-replica circuit 145 may also include an NMOS transistor controlled by the signal SIE and connected between the diode-replica 146 and a ground voltage.

Within this configuration, if a resistance value of the resistor $R_{GST}$ is essentially equal to that of the resistance variable element $R_{BIAS}$, the sensing node SDL will have a level of the reference voltage VREF. If a resistance value of the resistor $R_{GST}$ is greater than that of the resistance variable element $R_{BIAS}$, the sensing node SDL will have a voltage level higher than the reference voltage VREF. If a resistance value of the resistor $R_{GST}$ is less than that of the resistance variable element $R_{BIAS}$, the sensing node SDL may have a voltage level lower than the reference voltage VREF.

The operational amplifier OP_BIAS according to the illustrated embodiment of the inventive concept will thus generate a bias voltage signal which varies proportionally with the PVT variations. Thus, the resistance variable memory device 100 will operate in a manner that is insusceptible to the PVT variations.

In general, the resistance value of a resistor increases with temperature. But, the resistance of an element within a resistance variable memory device formed from a phase change material may actually decrease with an increase in temperature. Diodes typically have a positive temperature coefficient. That is, the resistance of a diode increases with temperature. Recognizing such properties, the resistance variable memory device 100 according to an embodiment of the inventive concept may use a diode-connected NMOS transistor to mitigate the effects of temperature variation. In other words, a diode-connected NMOS transistor may be configured with a negative temperature coefficient.

Figure 8:
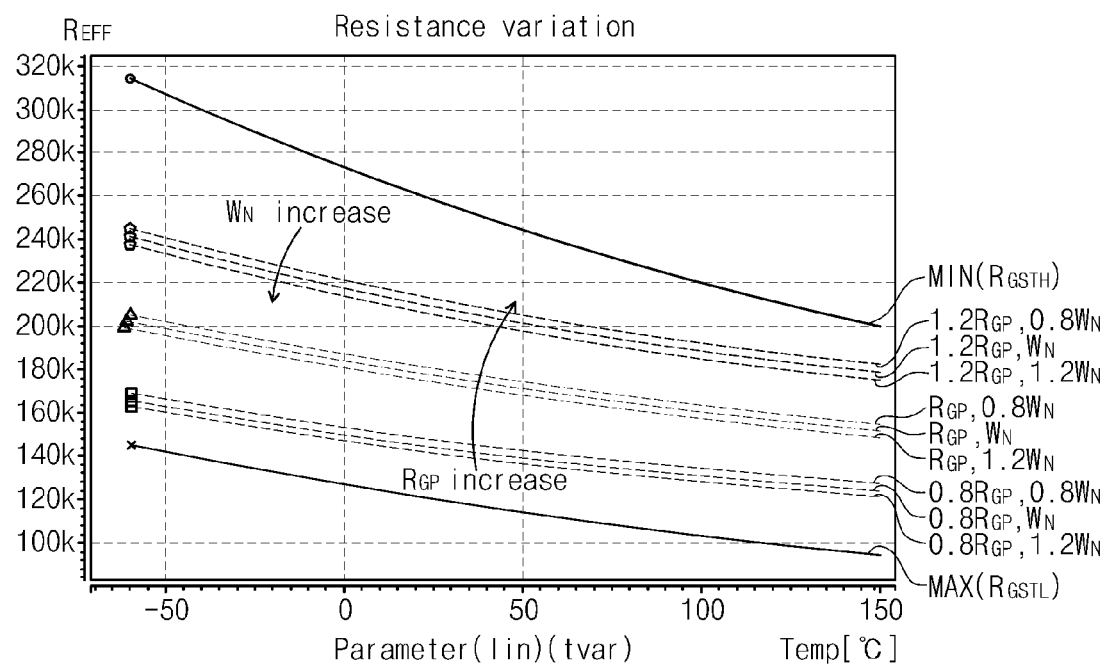
FIG. 8 is a graph illustrating a ratio of temperature to resistance value for a resistance variable memory device according to embodiments of the inventive concept.
Figure 9:
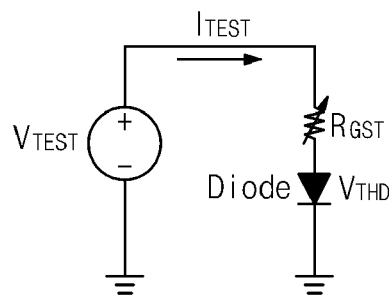
FIG. 9 is a circuit diagram conceptually illustrating a memory cell according to an embodiment of the inventive concept.
Figure 10:
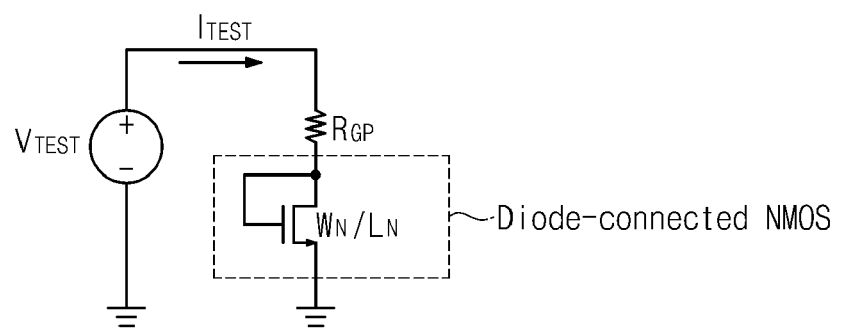
FIG. 10 is a circuit diagram conceptually illustrating a memory cell responsive to the pseudo-replica circuit in certain embodiments of the inventive concept.

Thus, the pseudo-replica circuit 145 mimic compensates for the effects of temperature variation using a conventional resistor $R_{BIAS}$ and a diode-connected NMOS transistor R_N2 (146) corresponding to the memory cell 110. Possible ratios for temperature variation as a function of resistance value for the resistance variable memory device according to embodiments of the inventive concept are illustrated in FIGS. 8 through 10.

Figure 3:
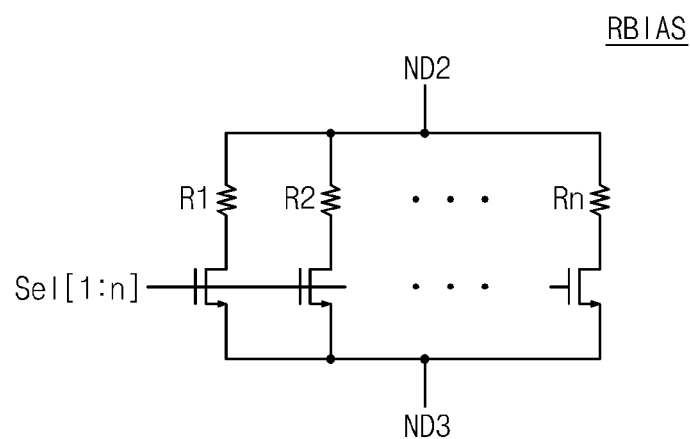
FIG. 3 is a circuit diagram illustrating a circuit replacing a resistance value of a resistor $R_{BIAS}$ in FIG. 2.

FIG. 3 illustrates one possible variation of the pseudo-replica circuit 145 of FIG. 2 wherein a circuit formed by parallel-connected resistors is used to provide the variable resistance value, $R_{BIAS}$. That is, FIG. 3 is a diagram illustrating a circuit that may be used to replace the resistor $R_{BIAS}$ of FIG. 2. Referring to FIG. 3, a resistance element $R_{BIAS}$ is connected between the second node ND2 and the third node ND3. The resistance element $R_{BIAS}$ includes a plurality of resistors R1 to Rn and a plurality of NMOS transistors. As illustrated in FIG. 3, the resistors R1 to Rn are respectively connected in series to a corresponding plurality of NMOS transistors. Each one of the plurality of NMOS transistors is respectively controlled by one of a plurality of select signals Sel[n:1]. The resistance value of the resistance element $R_{BIAS}$ may thus be controlled by selective activation of the select signals Sel[n:1].

Figure 4:
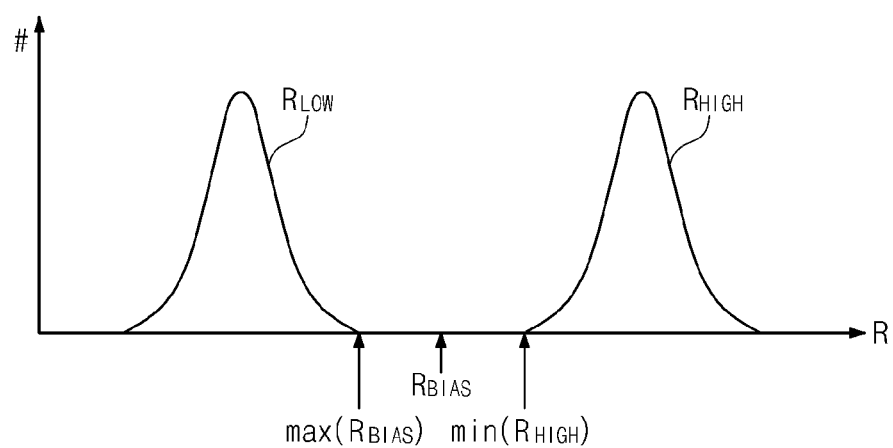
FIG. 4 is a graph illustrating a resistance distribution for the memory cells in the memory cell array of FIG. 1.

FIG. 4 is a graph illustrating resistance distributions for a resistance element within each memory cell of the memory cell array 110 of FIG. 1. As illustrated in FIG. 4, a resistance distribution includes an erased state $R_{LOW}$ and a programmed state $R_{HIGH}$. A resistance value of the resistor $R_{BIAS}$ exists between the maximum value max ($R_{LOW}$) of the erased state $R_{LOW}$ and a minimum value min ($R_{HIGH}$) of the programmed state $R_{HIGH}$.

Figure 5:
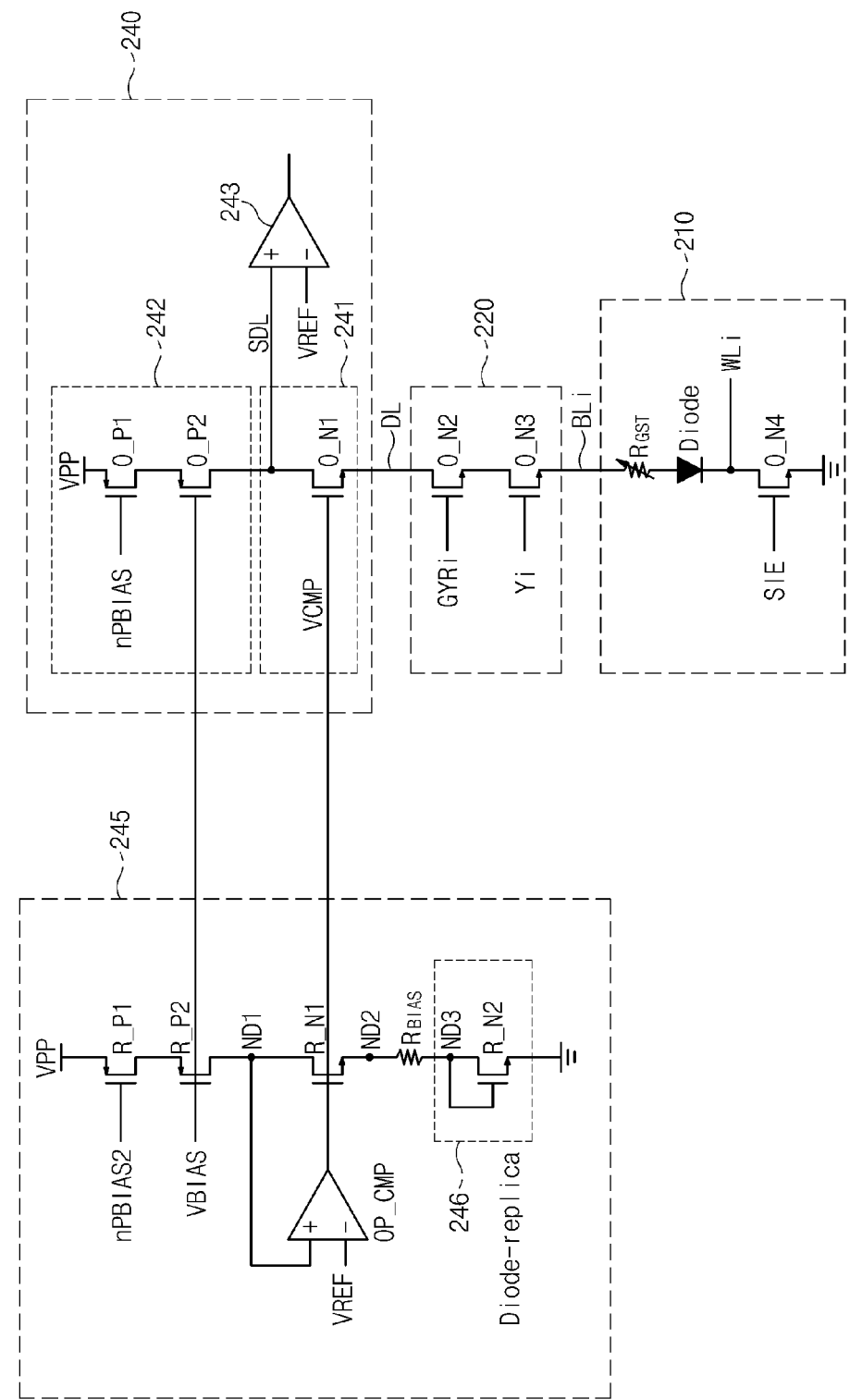
FIG. 5 is a circuit diagram illustrating in another embodiment of the inventive concept the sense amplifier circuit and pseudo-replica circuit of FIG. 1.

FIG. 5 is a circuit diagram illustrating a sense amplifier circuit 240 and a pseudo-replica circuit 245 according to another embodiment of the inventive concept. The pseudo-replica circuit 245 of FIG. 5 is similar to the pseudo-replica circuit 145 in FIG. 2, and common elements and features will not be reiterated. However, like the foregoing, the resistance variable memory device 200 illustrated in FIG. 5 provides a clamp voltage signal VCMP that mitigates the effects of PVT variations.

Referring collectively to FIGS. 1 and 5, the sense amplifier 240 includes a clamping circuit 241, a bias circuit 242, and a comparator 243. The pseudo-replica circuit 245 is configured to mimic compensate for the sense amplifier circuit 240 and a memory cell 210.

Although not shown in FIG. 5, the pseudo-replica circuit 245 may further comprise the same element as a bit line selection circuit 220 between the second node ND2 and a resistor $R_{BIAS}$. The pseudo-replica 245 may further comprise an NMOS transistor connected between a diode-replica 246 and a ground voltage and controlled by a signal SIE, although not shown in FIG. 5.

With continuing reference to FIG. 5, the pseudo-replica 245 comprises an NMOS transistor R_N1 corresponding to the clamp circuit 241, the first and second PMOS transistors R_P1 and R_P2 corresponding to the bias circuit 242, a resistor $R_{BIAS}$ corresponding to a resistance element in the memory cell 210, and a diode-replica 246 corresponding to a select element Diode of the memory cell 210. The diode-replica 246 is formed of a diode-connected NMOS transistor.

The first and second PMOS transistors R_P1 and R_P2 are connected in series between a boosted voltage VPP and the first node ND1. The first PMOS transistor R_P1 is controlled by a signal nPBIAS2 and the second PMOS transistor R_P2 is controlled by a bias voltage signal VBIAS.

The first NMOS transistor R_N1 is connected between the first node ND1 and the second node ND2 and is controlled by a clamp voltage signal VCMP being an output of an operational amplifier OP_CMP. A reference voltage VREF is applied to a negative terminal of the operational amplifier OP_CMP, and a voltage on the first node ND1 corresponding to the sensing node SDL is applied to a positive terminal of the operational amplifier OP_CMP.

The clamp voltage signal VCMP is applied identically to the NMOS transistors O_N1 and R_N1.

With this configuration, if a resistance value of the resistor $R_{GST}$ is essentially equal to that of the resistance variable element $R_{BIAS}$, the sensing node SDL will have the level of the reference voltage VREF. If a resistance value of the resistor $R_{GST}$ is greater than that of the resistance variable element $R_{BIAS}$, the sensing node SDL will have a voltage level higher than the reference voltage VREF. If a resistance value of the resistor $R_{GST}$ is less than that of the resistance variable element $R_{BIAS}$, the sensing node SDL will have a voltage level lower than the reference voltage VREF.

The operational amplifier OP_CMP may thus be used to generate a clamp voltage signal that varies proportionally with PVT variations. Thus, the resistance variable memory device 200 may be operated in a manner that is relatively insusceptible to PVT variations.

Figure 6:
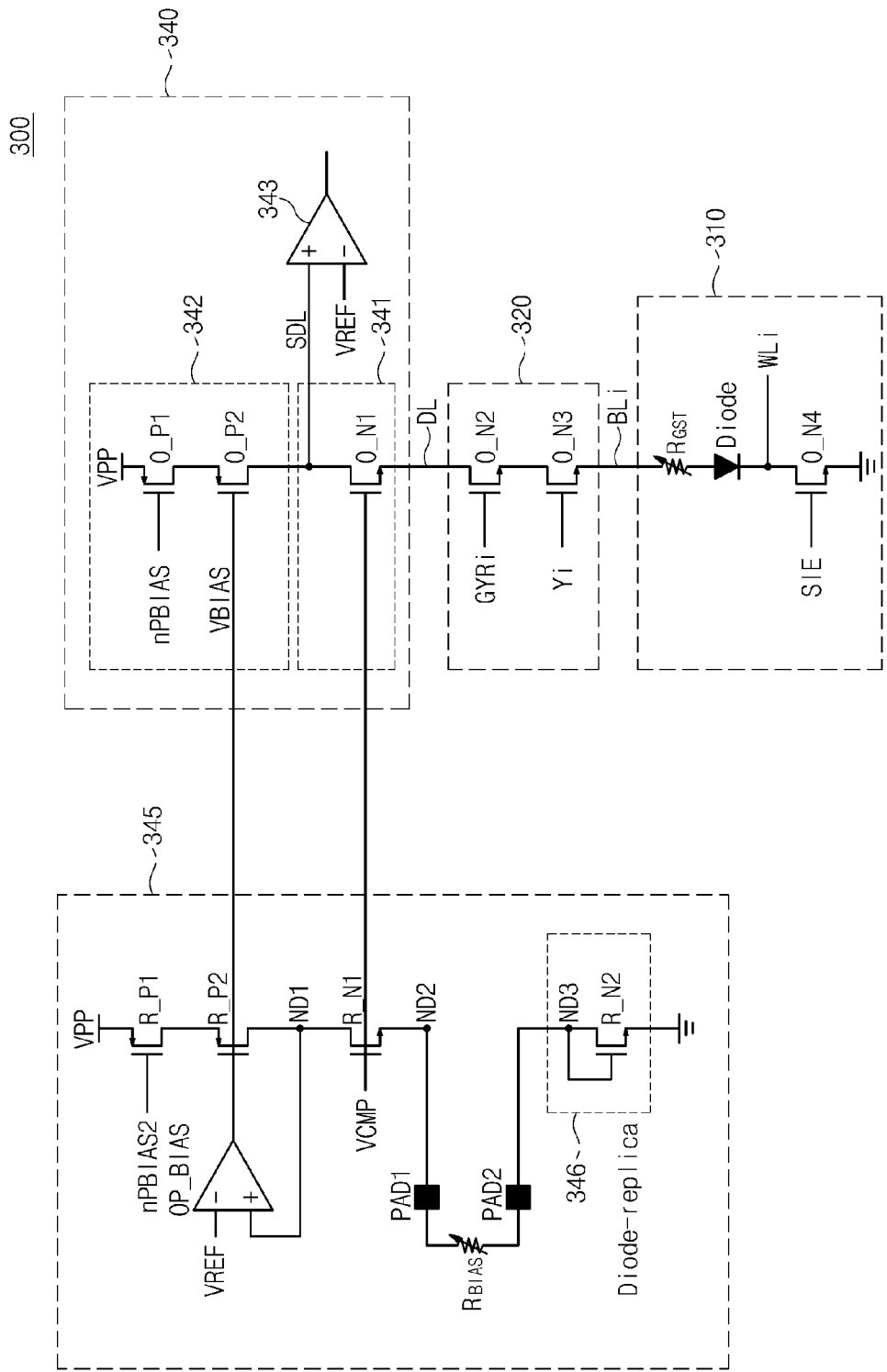
FIG. 6 is a circuit diagram illustrating in another embodiment of the inventive concept the sense amplifier circuit and pseudo-replica circuit of FIG. 1.

FIG. 6 is a circuit diagram illustrating an approach wherein the resistance value of the resistor $R_{BIAS}$ in the pseudo-replica circuit of FIG. 2 may be externally controlled. Thus, a pseudo-replica circuit 345 shown in FIG. 6 is similar to the pseudo-replica circuit 145 of FIG. 2. However, the resistance variable memory device 300 according to the embodiment of the inventive concept may be further configured such that the resistance value of a resistor $R_{BIAS}$ is externally controlled.

Referring to FIG. 6, a sense amplifier 340 includes a clamping circuit 341, a bias circuit 342, and a comparator 343. The pseudo-replica circuit 345 is configured to mimic compensate for the sense amplifier circuit 340 and a memory cell 310.

Although not shown in FIG. 6, the pseudo-replica 345 may further comprise the same element as a bit line selection circuit 320 between the second node ND2 and a resistor $R_{BIAS}$. The pseudo-replica 345 may further comprise an NMOS transistor connected between a diode-replica 346 and a ground voltage and controlled by a signal SIE, although not shown in FIG. 6.

With continuing reference to FIG. 6, the pseudo-replica circuit 345 comprises an NMOS transistor R_N1 corresponding to the clamp circuit 341, the first and second PMOS transistors R_P1 and R_P2 corresponding to the bias circuit 342, a resistor $R_{BIAS}$ corresponding to a resistance element in the memory cell 310, and a diode-replica 346 corresponding to a select element Diode of the memory cell 310. The diode-replica 346 is formed of a diode-connected NMOS transistor.

The first and second PMOS transistors R_P1 and R_P2 are connected in series between a boosted voltage VPP and the first node ND1. The first PMOS transistor R_P1 is controlled by a signal nPBIAS2 and the second PMOS transistor R_P2 is controlled by a bias voltage signal VBIAS.

A reference voltage VREF is applied to a negative terminal of the operational amplifier OP_BIAS, and a voltage on the first node ND1 corresponding to the sensing node SDL is applied to a positive terminal of the operational amplifier OP_BIAS. The bias voltage signal VBIAS is applied identically to the PMOS transistors O_P2 and R_P2. The first NMOS transistor R_N1 is connected between the first node ND1 and the second node ND2 and is controlled by a clamp voltage signal VCMP.

With this configuration, if a resistance value of the resistor $R_{GST}$ is essentially equal to that of the resistance variable element $R_{BIAS}$, the sensing node SDL will have a level of the reference voltage VREF. If a resistance value of the resistor $R_{GST}$ is greater than that of the resistance variable element $R_{BIAS}$, the sensing node SDL will have a voltage level higher than the reference voltage VREF. If a resistance value of the resistor $R_{GST}$ is less than that of the resistance variable element $R_{BIAS}$, the sensing node SDL may have a voltage level lower than the reference voltage VREF.

Thus, the pseudo-replica circuit 345 according to the illustrated embodiment of the inventive concept is configured such that the resistor $R_{BIAS}$ to be connected at the first and second pads PAD1 and PAD2 is capable of being externally controlled. In this manner, the resistance variable memory device 300 may generate the clamp voltage signal that varies proportionally with PVT variations by externally controlling the resistance value of the resistor $R_{BIAS}$.

Figure 7:
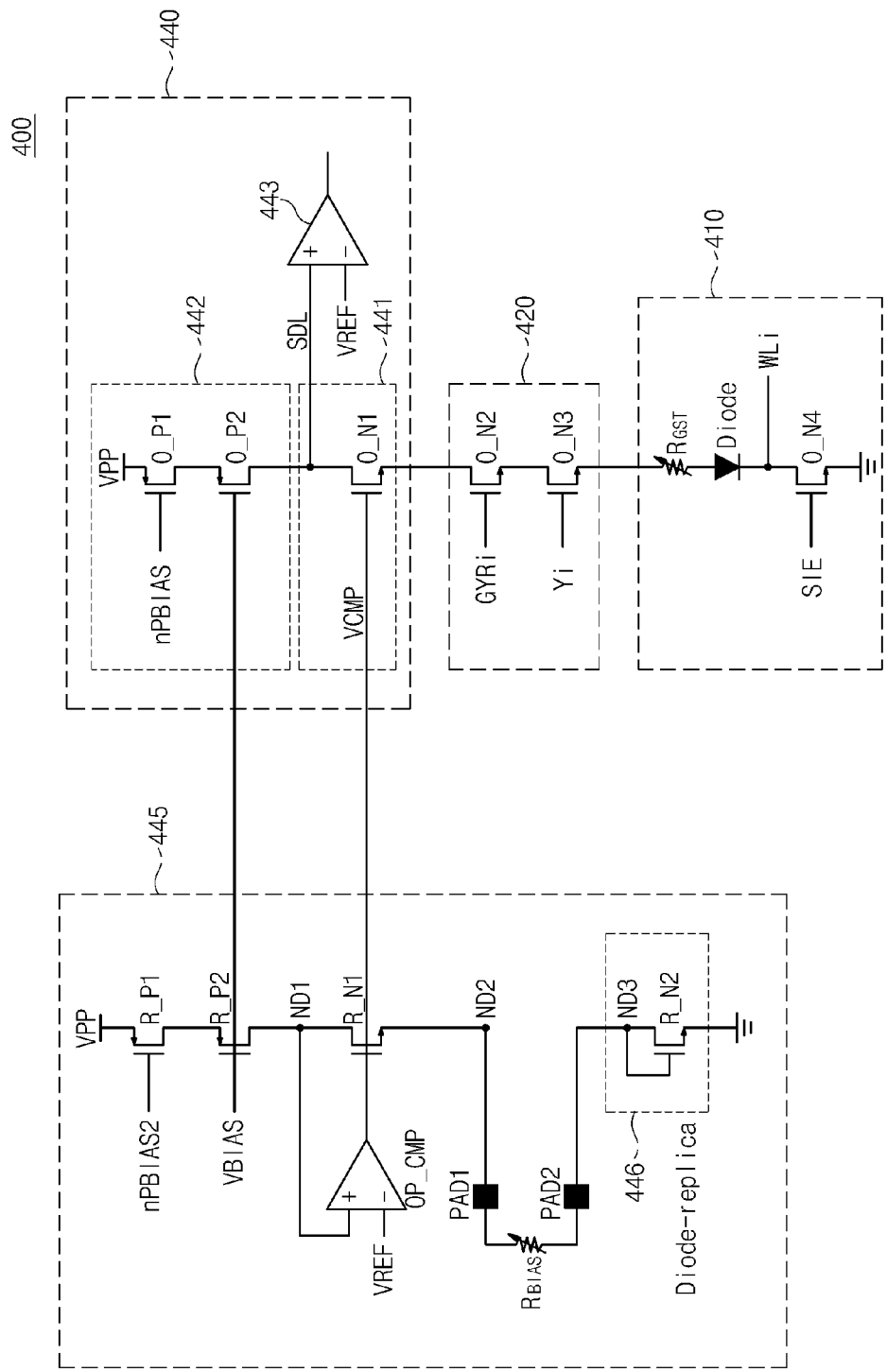
FIG. 7 is a circuit diagram illustrating in another embodiment of the inventive concept the sense amplifier circuit and pseudo-replica circuit of FIG. 1.

FIG. 7 is a circuit diagram illustrating another approach to the external control of the resistance value of a resistor $R_{BIAS}$ in the pseudo-replica circuit 245 of FIG. 5.

A pseudo-replica circuit 445 shown in FIG. 7 is similar to the pseudo-replica circuit 245 of FIG. 5. A resistance variable memory device 400 according to another embodiment of the inventive concept is configured such that the resistance value of a resistor $R_{BIAS}$ may be externally controlled.

Referring to FIG. 7, a sense amplifier 440 includes a clamping circuit 441, a bias circuit 442, and a comparator 443. The pseudo-replica circuit 445 according to the illustrated embodiment of the inventive concept is configured to mimic compensate for the sense amplifier circuit 440 and a memory cell 410.

Although not shown in FIG. 7, the pseudo-replica 445 may further comprise the same element as a bit line selection circuit 420 between the second node ND2 and a resistor $R_{BIAS}$. The pseudo-replica 445 may further comprise an NMOS transistor connected between a diode-replica 446 and a ground voltage and controlled by a signal SIE, although not shown in FIG. 7.

With continuing reference to FIG. 7, the pseudo-replica 445 comprises an NMOS transistor R_N1 corresponding to the clamp circuit 441, the first and second PMOS transistors R_P1 and R_P2 corresponding to the bias circuit 442, a resistor $R_{BIAS}$ corresponding to a resistance element in the memory cell 410, and a diode-replica 446 corresponding to a select element Diode of the memory cell 410. The diode-replica 446 is formed of a diode-connected NMOS transistor.

The first and second PMOS transistors R_P1 and R_P2 are connected in series between a boosted voltage VPP and the first node ND1. The first PMOS transistor R_P1 is controlled by a signal nPBIAS2 and the second PMOS transistor R_P2 is controlled by a bias voltage signal VBIAS.

The first NMOS transistor R_N1 is connected between the first node ND1 and the second node ND2 and is controlled by a clamp voltage signal VCMP being an output of an operational amplifier OP_CMP. A reference voltage VREF is applied to a negative terminal of the operational amplifier OP_CMP, and a voltage on the first node ND1 corresponding to the sensing node SDL is applied to a positive terminal of the operational amplifier OP_CMP. The clamp voltage signal VCMP is applied identically to the NMOS transistors O_N1 and R_N1.

With this configuration, if a resistance value of the resistor $R_{GST}$ is essentially equal to that of the resistance variable element $R_{BIAS}$, the sensing node SDL will have a level of the reference voltage VREF. If a resistance value of the resistor $R_{GST}$ is greater than that of the resistance variable element $R_{BIAS}$, the sensing node SDL may have a voltage level higher than the reference voltage VREF. If a resistance value of the resistor $R_{GST}$ is less than that of the resistance variable element $R_{BIAS}$, the sensing node SDL may have a voltage level lower than the reference voltage VREF.

The pseudo-replica circuit 445 according to the illustrated embodiment of the inventive concept is configured such that the resistor $R_{BIAS}$ to be connected at the first and second pads PAD1 and PAD2 may be externally controlled. Thus, the resistance variable memory device 400 may generate a clamp voltage signal that varies proportionally with PVT variations by externally controlling the resistance value of the resistor $R_{BIAS}$.

With reference to FIGS. 8 through 11, various approaches will be described in which a resistance variable memory device according to certain embodiments of the inventive concept are enabled to provide variation in a resistance value such that operation of the resistance variable memory device is relatively insusceptible to temperature variations.

FIG. 8 is a diagram illustrating a ratio between temperature and a resistance value for a resistance variable memory device according to an embodiment of the inventive concept. FIG. 9 is a circuit diagram illustrating an exemplary memory cell that may be used within the embodiment, and FIG. 10 is a diagram illustrating an equivalent circuit for the memory cell operated in response to a pseudo-replica circuit according to an embodiment of the inventive concept.

In general, the resistance value of a resistor $R_{GP}$ increases with temperature. But, as the temperature increases, the resistance value of a resistor $R_{GST}$, including a phase change material decreases within a memory cell of a resistance variable memory device. The corresponding diode has a positive temperature coefficient TC. That is, a resistance value of the diode increases with temperature.

Referring to FIGS. 8 through 10, a resistance variable memory device according to embodiments of the inventive concept may operate with a stable resistance value $R_{EFF}$ between a temperature range of −60° C. and +50° C. according to the following equation: $R_{EFF}=V_{TEST}/I_{TEST}$.

The resistance variable memory device 100 according to an embodiment of the inventive concept uses a diode-connected NMOS transistor, having a negative temperature coefficient TC, instead of a diode to prevent the influence due to the temperature variation. As illustrated in FIG. 8, the pseudo-replica circuit 145 is implemented to have a negative temperature coefficient TC using a resistor $R_{GP}$ and a diode-connected NMOS transistor.

With reference to FIG. 8, a symbol $W_N$ indicates a width of a channel of a diode-connected NMOS transistor, and a symbol $L_N$ indicates a length thereof. In an exemplary embodiment, the resistor $R_{GP}$ in the pseudo-replica has a temperature coefficient TC of 0.00079.

There is simulated the pseudo-replica at the conditions that the resistor RGP has a resistance value of 80K and that an error between −20% and +20% is applied to the width $W_N$ on the basis of 10 um.

FIGS. 11 through 15 show simulation results for the various pseudo-replica circuits illustrated in FIGS. 2 through 7.

Figure 11:
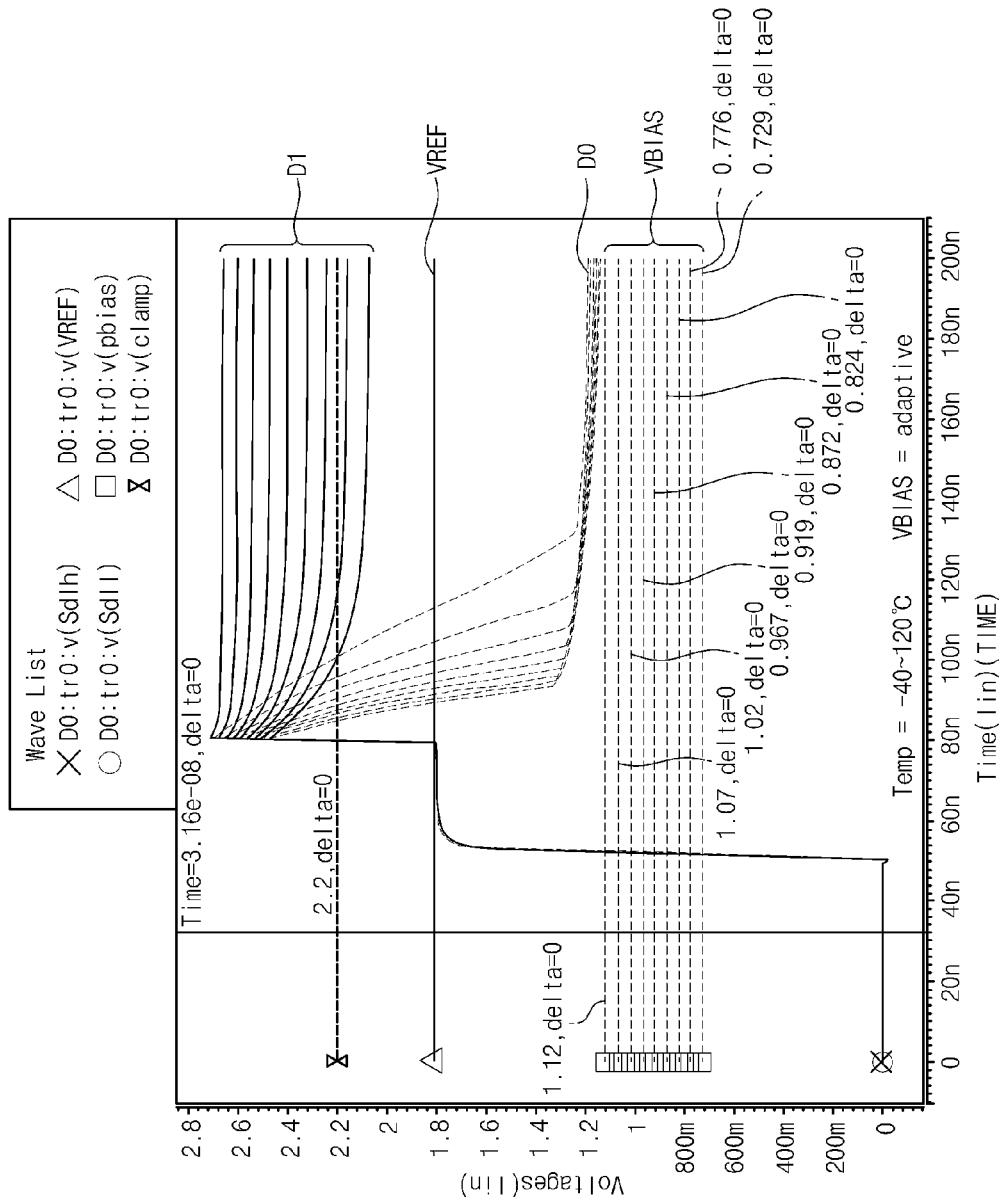
FIGS. 11 to 15 are graphical diagrams illustrating various simulation results for the pseudo-replica circuits of FIGS. 2 through 7.

As illustrated in FIG. 11, when the temperature ranges between −40° C. and −120° C., a bias voltage (pbias) is properly adjusted by a pseudo-replica circuit 145 of FIG. 2. That is, the bias voltage (pbias) is properly adjusted by the pseudo-replica circuit 145 is between 0.729V and 1.12V. FIG. 11 illustrates a resistance state D1 indicating a data value of '1' and a resistance state D0 indicating a data value of '0'.

Figure 12:
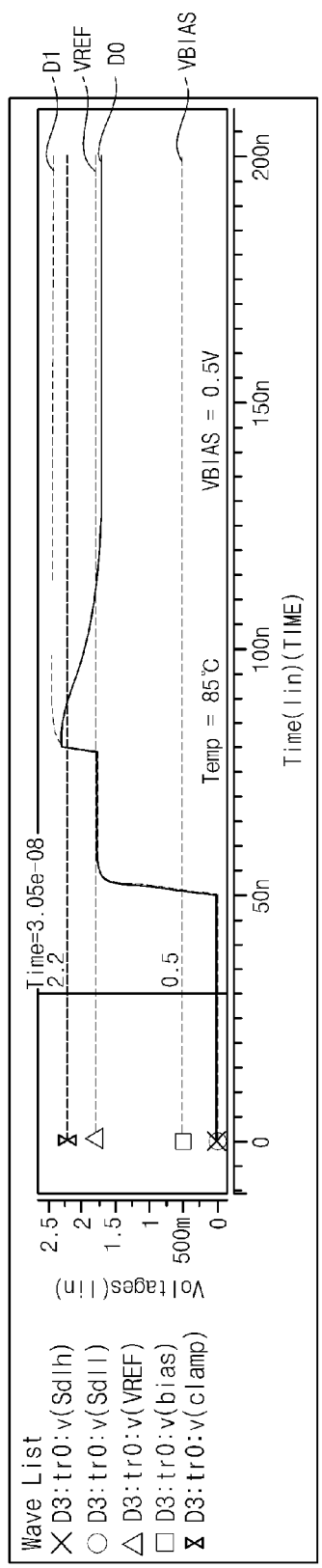

FIG. 12 shows a simulation result when a temperature is 85° C. and a bias voltage pbias is 0.5V. FIG. 12 illustrates a resistance state D1 indicating a data value of '1' placed over a reference voltage VREF, and a resistance state D0 indicating a data value of '0' placed below the VREF. It is easy to discriminate the resistance states D0 and D1 because the resistance states D0 and D1 are properly separated from the reference voltage VREF.

Figure 13:
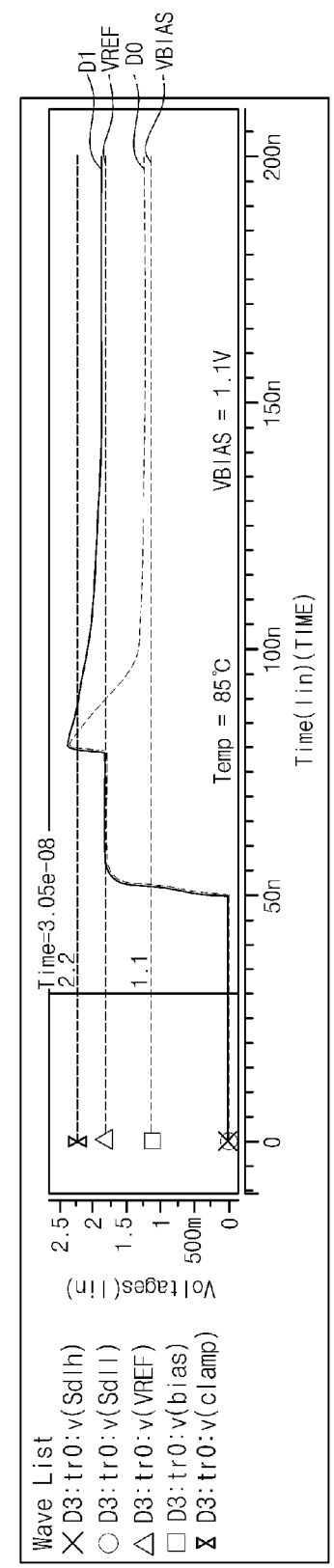

FIG. 13 shows a simulation result when a temperature is 85° C. and a bias voltage pbias is 1.1V. FIG. 13 illustrates a resistance state D1 indicating a data value of '1' placed over a reference voltage VREF, and a resistance state D0 indicating a data value of '0' placed below the VREF. It is difficult to discriminate the states D1 and D0 because the resistance state D1 is placed so close to the reference voltage VREF.

Thus, referring to FIGS. 12 and 13, in a case where the temperature is 85° C. it is proper to set the bias voltage pbias to 0.5V.

Figure 14:
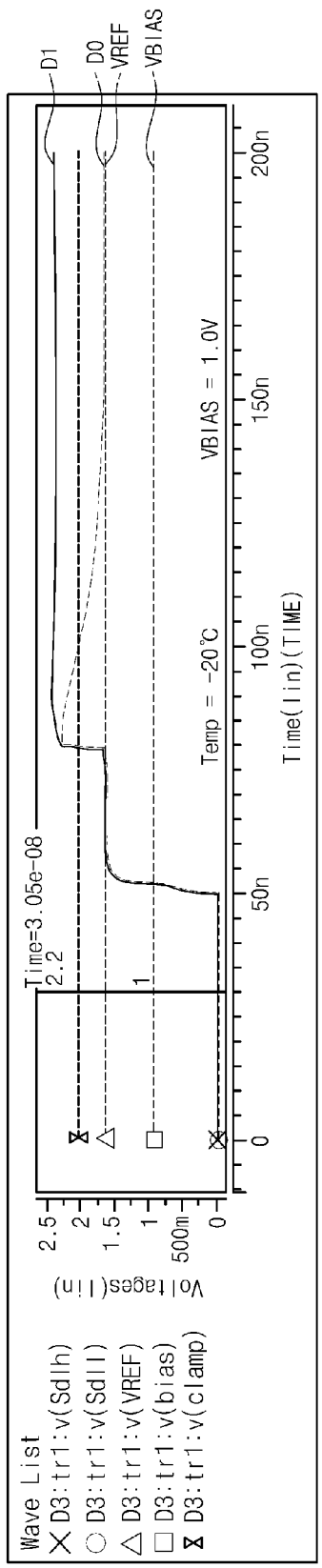

FIG. 14 shows a simulation result when a temperature −20° C. and a bias voltage pbias is 1.0V. FIG. 14 illustrates a resistance state D1 indicating a data value of '1' placed over a reference voltage VREF, and a resistance state D0 indicating a data value of '0' placed below the VREF.

It is impossible to discriminate between resistance states D0 and D1 because the resistance states D0 and D1 are placed over the reference voltage VREF.

Figure 15:
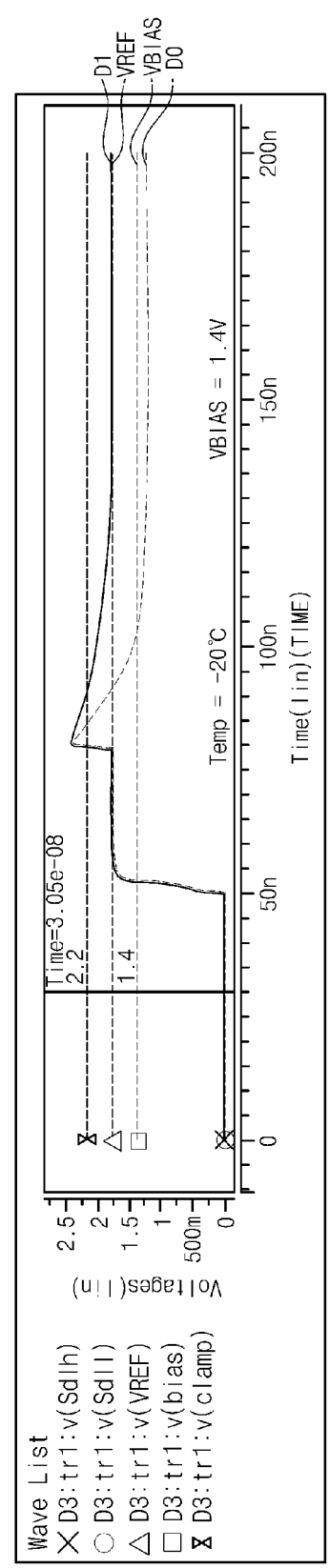

FIG. 15 shows a simulation result when a temperature −20° C. and a bias voltage pbias is 1.4V. FIG. 15 illustrates a resistance state D1 indicating a data value of '1' placed over a reference voltage VREF, and a resistance state D0 indicating a data value of '0' placed below the VREF. It is difficult to discriminate between the states D1 and D0 because the resistance state D1 is placed so close to the reference voltage VREF.

Thus, referring to FIGS. 14 and 15, in a case where the temperature is −20° C. and the bias voltage pbias is 1.0V, the reference voltage VREF is closer to the resistance state D0. In a case where the temperature is −20° C. and the bias voltage pbias is 1.4V, the reference voltage VREF is closer to the resistance state D1. Therefore, it is proper to set the bias voltage to have a voltage between 1.0V and 1.4V.

Referring to simulation results illustrated in FIGS. 11 to 15, the resistance variable memory device according to embodiments of the inventive concept may be configured to supply an appropriate bias voltage or clamping voltage, so that variations in a resistance value are reduced relative to variations in PVT.

Figure 16:
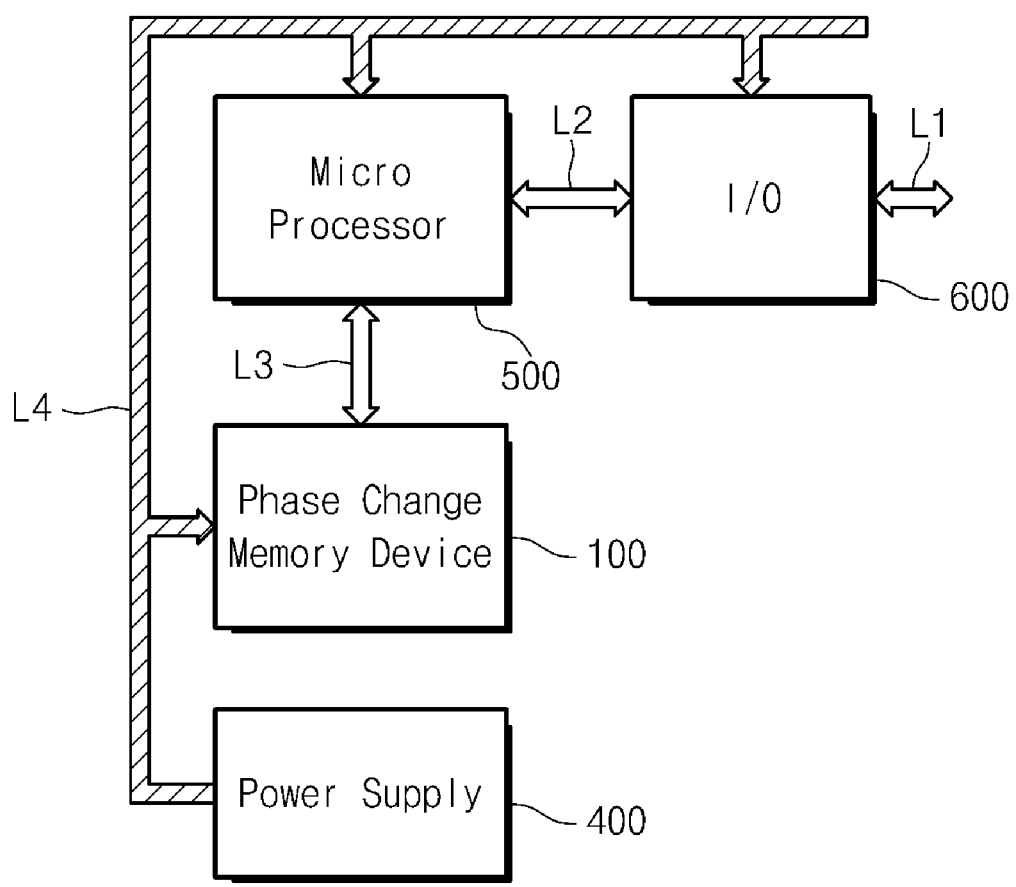
FIG. 16 is a block diagram of a portable electronic system including a resistance variable memory device according to an embodiment of the inventive concept.

FIG. 16 is a block diagram illustrating a portable electronic system including a resistance variable memory device according to an embodiment of the inventive concept. A resistance variable memory device according to the embodiment includes a phase change memory device.

The resistance variable memory device 100 is connected with a microprocessor 500 via a bus line L3 and functions as a main memory of the portable electronic system. The microprocessor 500, an input/output device 600, and the resistance variable memory device 100 are powered by a battery 400 via a power line L4.

In the event that data is provided to the input/output device 600 via a line L1, the microprocessor 500 receives the data via a line L2 to process the received data. The processed data is transferred to the resistance variable memory device 100 via the bus line L3 so as to be stored therein. Data stored in the resistance variable memory device 100 is read out by the microprocessor 500, and the read data is sent to the external via the input/output device 600.

Although not shown in figures, it is understood that a bias circuit and a clamp circuit in a sense amplifier circuit are configured to be controlled respectively by corresponding voltage signals VBIAS and VCMP which are varied via corresponding operational amplifiers according to the PVT variations. In this case, transistors R_P2 and R_N1 in a pseudo-replica circuit are controlled by outputs VBIAS and VCMP of corresponding operational amplifiers, respectively.

Although a power from the battery 400 is not supplied to the power line L4, data stored in the resistance variable memory device 100 is retained because of characteristics of the phase change material. This means that the memory device 100 is a non-volatile memory device unlike DRAM. Further, the resistance variable memory device 100 has such advantages that an operating speed is fast as compared with other memory devices and that it consumes less power.

The above-disclosed subject matter is to be considered illustrative, and not restrictive, and the appended claims are intended to cover all such modifications, enhancements, and other embodiments, which fall within the scope of the following claims. Thus, to the maximum extent allowed by law, the scope of the inventive concept should be determined by the broadest permissible interpretation of the following claims and their equivalents.

What is claimed is:

1. A resistance variable memory device comprising:
a memory cell connected to a bit line;
a sense amplifier circuit having a sensing capacity and configured to sense a sense voltage on the bit line; and
a pseudo-replica circuit providing the sense amplifier circuit with a control signal compensating for a drop in the sensing capacity of the sense amplifier circuit caused by variations in process, voltage and temperature (PVT),
wherein the sense amplifier circuit comprises:
a sensing node at which the sense voltage is apparent;
a comparator configured to compare the sense voltage with a reference voltage; and
a bias circuit configured to provide bias voltage to the bit line in response to the control signal, wherein the bias voltage is varied in response to the control signal.

2. The resistance variable memory device of claim 1, wherein the pseudo-replica circuit is implemented with elements configured to mimic compensate for the bias circuit.

3. The resistance variable memory device of claim 2, wherein the pseudo-replica comprises:
an operational amplifier configured to generate the control signal and having a negative terminal receiving the reference voltage and a positive terminal receiving the voltage apparent at the sensing node.

4. The resistance variable memory device of claim 1, wherein the memory cell comprises GST material.

5. The resistance variable memory device of claim 1, wherein the resistance variable memory device is PRAM.

6. A resistance variable memory device comprising:
a memory cell connected to a bit line;
a sense amplifier circuit having a sensing capacity and configured to sense a sense voltage on the bit line; and
a pseudo-replica circuit providing the sense amplifier circuit with a control signal compensating for a drop in the sensing capacity of the sense amplifier circuit caused by variations in process, voltage and temperature (PVT),
wherein the sense amplifier circuit comprises a sensing node at which the sense voltage is apparent; a comparator configured to compare the sense voltage with a reference voltage; and a first bias circuit configured to provide bias voltage to the bit line in response to the control signal,
wherein the bias voltage is varied in response to the control signal,
wherein the pseudo-replica circuit comprises a second bias circuit which is constructed to the same configuration as the first bias circuit.

7. A resistance variable memory device comprising:
a memory cell connected to a bit line;
a sense amplifier circuit having a sensing capacity and configured to sense a sense voltage on the bit line; and
a pseudo-replica circuit providing the sense amplifier circuit with a control signal compensating for a drop in the sensing capacity of the sense amplifier circuit caused by variations in process, voltage and temperature (PVT),
wherein the sense amplifier circuit comprises:
a clamp circuit configured to clamp a voltage on the bit line to generate a clamp voltage in response to the control signal;
a sensing node at which the sense voltage is apparent;
a comparator configured to compare the sense voltage with a reference voltage; and
a bias circuit configured to provide bias voltage to the bit line in response to the control signal, wherein the bias voltage is varied in response to the control signal.

8. The resistance variable memory device of claim 7, wherein the pseudo-replica circuit is implemented with elements configured to mimic compensate for the bias circuit.

9. The resistance variable memory device of claim 8, wherein the pseudo-replica circuit comprises an operational amplifier configured to generate the control signal and having a negative terminal receiving the reference voltage and a positive terminal receiving the voltage apparent at the sensing node.

10. A resistance variable memory device comprising:
a memory cell connected to a bit line;
a sense amplifier circuit having a sensing capacity and configured to sense a sense voltage on the bit line; and
a pseudo-replica circuit providing the sense amplifier circuit with a control signal compensating for a drop in the sensing capacity of the sense amplifier circuit caused by variations in process, voltage and temperature (PVT),
wherein the sense amplifier circuit comprises a first clamp circuit configured to clamp a voltage on the bit line to generate a clamp voltage in response to the control signal; a sensing node at which the sense voltage is apparent; a comparator configured to compare the sense voltage with a reference voltage; a bias circuit configured to provide bias voltage to the bit line in response to the control signal, wherein the clamp voltage is varied in response to the control signal, wherein the pseudo-replica circuit comprises a second clamp circuit which is constructed to the same configuration as the first clamp circuit.

11. A resistance variable memory device comprising:

a memory cell connected to a bit line;

a sense amplifier circuit having a sensing capacity and configured to sense a sense voltage on the bit line; and a pseudo-replica circuit providing the sense amplifier circuit with a control signal compensating for a drop in the sensing capacity of the sense amplifier circuit caused by variations in process, voltage and temperature (PVT), wherein the sense amplifier circuit comprises:

a bias circuit configured to provide a bias voltage to the bit line; and a clamp circuit configured to clamp a voltage on the bit line to generate a clamp voltage, wherein the bias voltage and the clamp voltage are varied according to the control signal.

12. A resistance variable memory device comprising:

a memory cell connected to a bit line;

a sense amplifier circuit having a sensing capacity and configured to sense a sense voltage on the bit line; and a pseudo-replica circuit providing the sense amplifier circuit with a control signal compensating for a drop in the sensing capacity of the sense amplifier circuit caused by variations in process, voltage and temperature (PVT), wherein the memory cell comprises:

a storage element formed from a phase change material; and a diode configured to select the memory cell, wherein the pseudo-replica circuit comprises a resistance element similar to the storage element and a diode-connected NMOS transistor configured to select the resistance element.

13. The resistance variable memory device of claim 12, wherein a resistance value for the resistance element is externally controlled.

* * * * *